(12) United States Patent
Guo et al.

(10) Patent No.: US 12,514,103 B2
(45) Date of Patent: Dec. 30, 2025

(54) FLEXIBLE SUBSTRATE, DISPLAY PANEL AND METHOD FOR MANUFACTURING THE SAME

(71) Applicants: Chengdu BOE Optoelectronics Technology Co., Ltd., Sichuan (CN); BOE Technology Group Co., Ltd., Beijing (CN)

(72) Inventors: Yuanzheng Guo, Beijing (CN); Liqiang Chen, Beijing (CN); Wei Xia, Beijing (CN); Jie Li, Beijing (CN); Tao Gao, Beijing (CN); Weifeng Zhou, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 600 days.

(21) Appl. No.: 17/914,231

(22) PCT Filed: Oct. 28, 2021

(86) PCT No.: PCT/CN2021/126956
§ 371 (c)(1),
(2) Date: Sep. 23, 2022

(87) PCT Pub. No.: WO2022/179154
PCT Pub. Date: Sep. 1, 2022

(65) Prior Publication Data
US 2023/0110949 A1    Apr. 13, 2023

(30) Foreign Application Priority Data
Feb. 26, 2021  (CN) .......................... 202110221180.6

(51) Int. Cl.
*H10K 77/10* (2023.01)
*B32B 3/12* (2006.01)
(Continued)

(52) U.S. Cl.
CPC .............. *H10K 77/111* (2023.02); *B32B 3/12* (2013.01); *B32B 15/20* (2013.01); *H10K 59/122* (2023.02);
(Continued)

(58) Field of Classification Search
None
See application file for complete search history.

(56) References Cited

U.S. PATENT DOCUMENTS 12,268,050 B2 *   4/2025  Chen .................... H10K 50/865
2011/0193067 A1   8/2011  Lee et al.
(Continued)

FOREIGN PATENT DOCUMENTS

| CN | 104167424 A | 11/2014 |
| CN | 107706215 A | 2/2018 |

(Continued)

OTHER PUBLICATIONS

CN2021102211806 first office action.
(Continued)

*Primary Examiner* — Michelle Mandala
(74) *Attorney, Agent, or Firm* — IPro, PLLC

(57) ABSTRACT

A flexible substrate, including: a first organic layer, an inorganic barrier layer, a metal layer and a second organic layer which are stacked in sequence, and the metal layer is for improving binding force between the inorganic barrier layer and the second organic layer. According to embodiments of the present disclosure, the metal layer is provided between the inorganic barrier layer and the second organic layer, so as to improve bonding force between the inorganic (Continued)

barrier layer and the second organic layer, prevent the second organic layer from peeling off from the inorganic barrier layer, and further improve reliability of a flexible display device.

12 Claims, 4 Drawing Sheets

(51) Int. Cl.
| | |
|---|---|
| *B32B 15/20* | (2006.01) |
| *H10K 59/122* | (2023.01) |
| *H10K 59/65* | (2023.01) |
| *H10K 71/00* | (2023.01) |
| *H10K 71/10* | (2023.01) |
| *H10K 71/16* | (2023.01) |
| *B32B 9/04* | (2006.01) |
| *B32B 15/08* | (2006.01) |
| *B32B 27/28* | (2006.01) |
| *H10K 59/12* | (2023.01) |
| *H10K 102/00* | (2023.01) |

(52) U.S. Cl.
CPC ............. *H10K 59/65* (2023.02); *H10K 71/00* (2023.02); *H10K 71/164* (2023.02); *H10K 71/166* (2023.02); *H10K 71/191* (2023.02); *B32B 9/041* (2013.01); *B32B 9/045* (2013.01); *B32B 15/08* (2013.01); *B32B 27/281* (2013.01); *B32B 2255/10* (2013.01); *B32B 2255/28* (2013.01); *B32B 2307/7246* (2013.01); *B32B 2307/732* (2013.01); *B32B 2307/748* (2013.01); *B32B 2457/206* (2013.01); *H10K 59/1201* (2023.02); *H10K 2102/311* (2023.02)

(56) References Cited

U.S. PATENT DOCUMENTS

| | | | |
|---|---|---|---|
| 2014/0272350 A1* | 9/2014 | Kim | ............ C23C 16/26 427/430.1 |
| 2014/0339517 A1 | 11/2014 | Park et al. | |
| 2021/0359234 A1 | 11/2021 | Li | |

FOREIGN PATENT DOCUMENTS

| | | |
|---|---|---|
| CN | 109979977 A | 7/2019 |
| CN | 113013363 A | 6/2021 |

OTHER PUBLICATIONS

CN2021102211806 second office action.
PCT/CN2021/126956 international search report.
PCT/CN2021/126956 Written Opinion.

* cited by examiner

FLEXIBLE SUBSTRATE, DISPLAY PANEL AND METHOD FOR MANUFACTURING THE SAME

CROSS-REFERENCE TO RELATED APPLICATION

The present application is a U.S. National Stage of International application No. PCT/CN2021/126956 filed on Oct. 28, 2021, which claims a priority of the Chinese patent application No. 202110221180.6 filed on Feb. 26, 2021, all of which are incorporated herein by reference in their entirety for all purposes.

TECHNICAL FIELD

The present disclosure relates to display device technologies, in particular to flexible substrates, display panels and manufacturing methods thereof.

BACKGROUND

In recent years, with rapid development of flexible display technologies, industry has higher expectations for bending properties of flexible display devices. A radius of curvature has evolved from 20 mm to 5 mm and is progressing towards 3 mm and even 1 mm.

At present, flexible substrates generally use double-layer polyimide (PI), and an inorganic layer is functioned as a water vapor barrier layer in a middle of the double-layer PI. However, in practical use, it is found that the double-layer PI may reduce reliability of the flexible display device.

SUMMARY

The present disclosure provides flexible substrates, display panels and manufacturing methods thereof to alleviate deficiencies in related arts.

In order to achieve the above purpose, a first aspect of embodiments of the present disclosure provides a flexible substrate, including a first organic layer, an inorganic barrier layer, a metal layer, and a second organic layer which are stacked in sequence, and the metal layer is for improving bonding force between the inorganic barrier layer and the second organic layer.

Optionally, a Material of the Metal Layer Includes at Least One of Aluminum, Silver, Nickel, Magnesium or Molybdenum.

Optionally, the material of the metal layer includes at least one of aluminum, silver, nickel or magnesium. Optionally, a thickness of the metal layer ranges from 50 Å to 10000 Å. Optionally, the thickness of the metal layer ranges from 200 Å to 1000 Å.

Optionally, the material of the metal layer includes molybdenum. Optionally, the thickness of the metal layer ranges from 50 Å to 10000 Å. Optionally, the thickness of the metal layer ranges from 500 Å to 2000 Å.

Optionally, the metal layer is a metal pattern layer including a plurality of sub metal blocks, where a hollow area is between adjacent sub metal blocks.

A second aspect of the embodiments of the present disclosure provides a display panel including any flexible substrate according to the above.

Optionally, the display panel includes a display area, the metal layer is a metal pattern layer including a plurality of sub metal blocks, where a hollow area is between adjacent sub metal blocks, and the plurality of sub metal blocks and the hollow areas correspond to the display area.

Optionally, the display panel includes a display area, the metal layer is a metal pattern layer including a plurality of connection strips defining a plurality of hollow areas, and the plurality of connection strips and the plurality of hollow areas correspond to the display area.

Optionally, the display panel includes an image acquisition area located in the display area; the image acquisition area corresponds to the hollow area.

A third aspect of the embodiments of the present disclosure provides a manufacturing method of a display panel, including:
manufacturing a pixel structure on the flexible substrate according to any one of the above.

Optionally, manufacturing the pixel structure includes:
forming a first metal material layer on a side of the second organic layer away from the first organic layer, patterning the first metal material layer to form an anode;
forming a pixel definition layer on a side of the anode and the second organic layer away from the first organic layer, patterning the pixel definition layer to form an opening exposing the anode;
evaporation coating an organic light-emitting material layer within the opening; and
evaporation coating a cathode material layer on a side of the organic light-emitting material layer and the pixel definition layer away from the first organic layer;
where the metal layer of the flexible substrate is a metal pattern layer; the metal pattern layer is functioned as an alignment marker when a mask for patterning the first metal material layer is aligned with the flexible substrate, and/or the metal pattern layer is functioned as an alignment marker when a mask for patterning the pixel definition layer is aligned with the flexible substrate, and/or the metal pattern layer is functioned as an alignment marker when a mask for evaporation coating the organic light-emitting material layer is aligned with the flexible substrate, and/or the metal pattern layer is functioned as an alignment marker when a mask for evaporation coating the cathode material layer is aligned with the flexible substrate; or
where the second organic layer has an alignment marker on a side away from the first organic layer, and the metal layer has a hollow area, the hollow area corresponds to the alignment marker, to expose the alignment marker when the mask for patterning the first metal material layer is aligned with the flexible substrate, and/or to expose the alignment marker when the mask for patterning the pixel definition layer is aligned with the flexible substrate, and/or to expose the alignment marker when the mask for evaporation coating the organic light-emitting material layer is aligned with the flexible substrate, and/or to expose the alignment marker when the mask for evaporation coating the cathode material layer is aligned with the flexible substrate.

Optionally, prior to manufacturing the pixel structure, manufacturing a pixel driving circuit on the side of the second organic layer away from the first organic layer, the pixel driving circuit includes a transistor and/or a capacitor; the transistor includes a gate electrode, an active layer, a source electrode and a drain electrode; the capacitor includes a first pole plate and a second pole plate;
where the metal layer of the flexible substrate is a metal pattern layer; the metal pattern layer is functioned as an alignment marker when a mask for manufacturing the gate electrode is aligned with the flexible substrate, and/or the metal pattern layer is functioned as an alignment marker when a mask for manufacturing the active layer is aligned with the flexible substrate, and/or the metal pattern layer is functioned as an alignment marker when a mask for manufacturing the source electrode and the drain electrode is aligned with the flexible substrate, and/or the metal pattern layer is functioned as an alignment marker when a mask for manufacturing the first pole plate is aligned with the flexible substrate, and/or the metal pattern layer is functioned as an alignment marker when a mask for manufacturing the second pole plate is aligned with the flexible substrate; or where the second organic layer has an alignment marker on a side away from the first organic layer, and the metal layer has a hollow area, the hollow area corresponds to the alignment marker, to expose the alignment marker when the mask for manufacturing the gate electrode is aligned with the flexible substrate, and/or to expose the alignment marker when the mask for manufacturing the active layer is aligned with the flexible substrate, and/or to expose the alignment marker when the mask for manufacturing the source electrode and the drain electrode is aligned with the flexible substrate, and/or to expose the alignment marker when the mask for manufacturing the first pole plate is aligned with the flexible substrate, and/or to expose the alignment marker when the mask for manufacturing the second pole plate is aligned with the flexible substrate.

The inventors of the present disclosure analyzed a reason why reliability of a flexible display device is reduced due to a double-layer PI in related arts, and found that this is due to the separation of the double-layer PI, where binding force between a inorganic water vapor barrier layer and an upper layer PI is much smaller than binding force between the inorganic water vapor barrier layer and a lower layer PI. When the display device is used in environments of high temperature and high humidity and curls multiple times, the bonding force between the inorganic water vapor barrier layer and the lower layer PI becomes poor, and the two are separated. According to the above embodiments of the present disclosure, a metal layer is provided between an inorganic barrier layer and a second organic layer, so as to improve bonding force between the inorganic barrier layer and the second organic layer, alleviate the peeling off of the second organic layer from the inorganic barrier layer, and further improve the reliability of the flexible display device.

It should be understood that the above general descriptions and the below detailed descriptions are merely examples and explanation, and are not intended to limit the present disclosure.

BRIEF DESCRIPTION OF THE DRAWINGS

The accompanying drawings herein, which are incorporated into the specification and constitute a part of this specification, illustrate embodiments consistent with the present disclosure and, together with the specification, serve to explain the principles of the present disclosure.

LIST OF REFERENCE SYMBOLS

Figure 1:
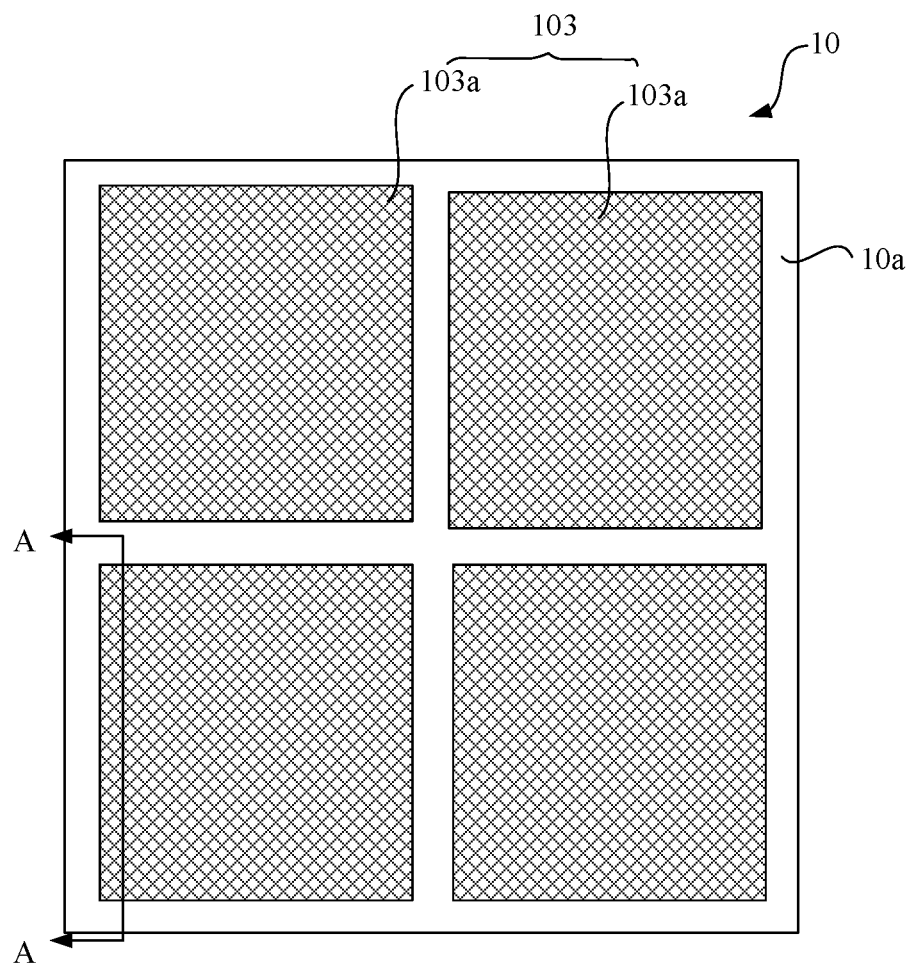
FIG. 1 is a top view of a flexible substrate according to a first embodiment of the present disclosure.

| | |
|---|---|
| flexible substrate 10 | first organic layer 101 |
| inorganic barrier layer 102 | metal layer 103 |
| second organic layer 104 | sub metal block 103a |
| hollow area10a | display panel 1, 1', 1" |
| display area 1a | pixel structure 30 |
| anode 30a | cathode 30b |
| light-emitting block 30c | transistor T |
| active layer 11 | gate insulation layer 12 |
| gate electrode 13 | source electrode 14a |
| drain electrode 14b | capacitor C |
| first pole plate 21 | second pole plate 22 |
| first interlayer dielectric layer ILD1 | second interlayer dielectric layer ILD2 |
| passivation layer PVX | planarization layer PLN |
| active material layer 11' | mask 2 |
| pixel definition layer PDL | cathode material layer 301 |
| alignment marker 201 | connection strip 103b |

Detailed Description of the Embodiments

Examples of embodiments will be described in detail here, examples of which are illustrated in the accompanying drawings. When the following description relates to the accompanying drawings, unless specified otherwise, the same numerals in different drawings represent the same or similar elements. The examples described in the following examples do not represent all examples consistent with the present disclosure. Rather, they are merely device examples consistent with some aspects of the present disclosure as detailed in the appended claims.

Figure 2:
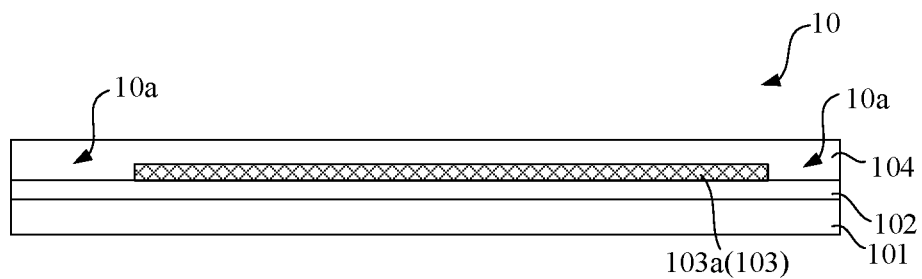
FIG. 2 is a sectional view along line A-A of FIG. 1.

FIG. 1 is a top view of a flexible substrate according to a first embodiment of the present disclosure. FIG. 2 is a sectional view along line A-A of FIG. 1.

Referring to FIGS. 1 and 2, a flexible substrate 10 includes: a first organic layer 101, an inorganic barrier layer 102, a metal layer 103 and a second organic layer 104 which are arranged in sequence stacked. The metal layer 103 is for improving bonding force between the inorganic barrier layer 102 and the second organic layer 104.

Materials of the first organic layer 101 and the second organic layer 104 may be organic flexible materials such as polyimide (PI).

The inorganic barrier layer 102 may be one or more inorganic layers, such as silicon nitride layer(s), silicon dioxide layer(s), and the like.

Both the metal layer 103 and the inorganic barrier layer 102 use inorganic materials, so bonding force between them is strong and it is difficult to separate them.

A material of the metal layer 103 may include at least one of aluminum, silver, nickel or magnesium, for example, a single substance or alloy of aluminum, silver, nickel or magnesium. Aluminum, silver, nickel and magnesium are weakly basic and may react slowly with weakly acidic polyacrylic acid (PAA) to form a dense layer to improve bonding force between the metal layer 103 and the second organic layer 104. The polyacrylic acid is cured to form a second organic layer 104 of polyimide material. The metal layer 103 may be a single layer structure or a stacked-layer structure. A material of the single layer structure may be a mixture of one or more of aluminum, silver, nickel or magnesium. A material of each layer in the stacked-layer structure may be one of aluminum, silver, nickel or magnesium. A thickness of the metal layer 103 may range from 50 Å to 10000 Å (angstrom), for example, 100 Å to 8000 Å, and further, 150 Å to 5000 Å. Preferably, the thickness of the metal layer 103 may range from 200 Å to 1000 Å.

A value range of this embodiment includes endpoint values.

The material of the metal layer 103 may also be molybdenum. Roughness of molybdenum is large, for example, 5 nm-15 nm. Molybdenum may form an embedded structure with the second organic layer 104 to improve the bonding force between the metal layer 103 and the second organic layer 104. The material of the metal layer 103 may also be a metal with a roughness greater than that of molybdenum. The thickness of the metal layer 103 may range from 50 Å to 10000 Å, for example, 200 Å to 8000 Å, and further, 300 Å to 5000 Å. Preferably, the thickness of the metal layer 103 may range from 500 Å to 2000 Å.

In some embodiments, the material of a part of the metal layer 103 may be molybdenum, and the material of other parts of the metal layer 103 may be at least one of aluminum, silver, nickel or magnesium.

In this embodiment, as shown in FIG. 1, the metal layer 103 includes a plurality of sub metal blocks 103a, where a hollow area 10a is between adjacent sub metal blocks 103a. In other embodiments, the metal layer 103 may also include one sub metal block 103a.

In order to verify peeling strength of the flexible substrate 10, controlled experiments are carried out in this embodiment, where first organic layers 101, inorganic barrier layers 102, and second organic layers 104 of Sample 1, Sample 2 and a control sample have an identical material and an identical thickness, and metal layers 103 of Sample 1 and Sample 2 have an identical pattern of the sub metal blocks 103a and hollow areas 10a. Results of the controlled experiments are shown in Table 1:

TABLE 1

| Sample | Average peeling strength of 5 tests (gf/mm) |
|---|---|
| Sample 1 (metal layer of 500 Å aluminum) | 39.05 |
| Sample 2 (metal layer of 500 Å molybdenum) | 47.88 |
| Control sample (without metal layer) | 4.97 |

It can be seen that when the second organic layer 104 is peeled off from the inorganic barrier layer 102, the peeling strength required for peeling off the second organic layer 104 per unit width is much greater in Sample 1 and Sample 2 than that in the control sample.

Figure 3:
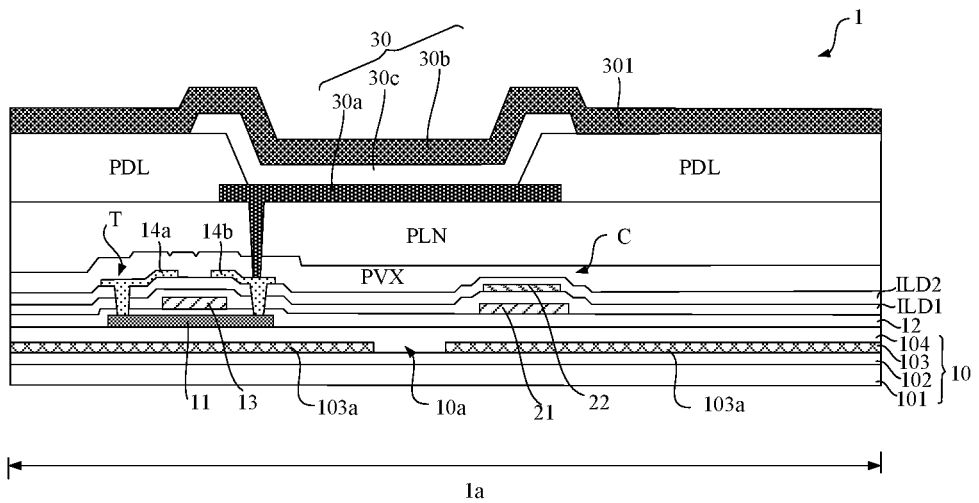
FIG. 3 is a schematic diagram of a cross-sectional structure of a display panel according to a first embodiment of the present disclosure.

A display panel is provided by the first embodiment of the present disclosure. FIG. 3 is a schematic diagram of a cross-sectional structure of the display panel. As shown in FIG. 3, the display panel 1 includes a flexible substrate 10.

The display panel 1 may include a display area 1a. The metal layer 103 includes a plurality of sub metal blocks 103a, where a hollow area 10a is between adjacent sub metal blocks 103a, and the plurality of sub metal blocks 103a and the hollow area 10a correspond to the display area 1a.

The display area 1a is provided with several pixel structures 30 arranged in an array. Each of the pixel structures 30 includes: an anode 30a, a cathode 30b, and a light-emitting block 30c arranged between the anode 30a and the cathode 30b. A material of the light-emitting block 30c may be an OLED (Organic Light-Emitting Diode). The light-emitting block 30c may be red, green or blue, or may be red, green, blue or yellow. The pixel structures 30 of a red-green-blue three-primary color or of a red-green-blue-yellow four-primary color are alternately distributed. Cathodes 30b of each pixel structure 30 may be connected together to form a surface electrode.

Referring to FIG. 3, in this embodiment, a pixel driving circuit including several transistors is arranged between the anode 30a and the flexible substrate 10, and the anode 30a is electrically connected to a drain electrode 14b of a transistor T. In other words, the pixel structure 30 may be an Active Matrix OLED (AMOLED).

The Active Matrix OLED, also known as active-driven light-emitting mode OLED, which uses a transistor array to control each of pixels to emit light, and each of the pixels may emit light continuously.

The pixel driving circuit includes the transistor T and a capacitor C. The transistor T may include: an active layer 11, a gate insulation layer 12, a gate electrode 13, a source electrode 14a and a drain electrode 14b.

The capacitor C may include: a first pole plate 21, a capacitor dielectric layer and a second pole plate 22.

In this embodiment, the active layer 11 is close to the flexible substrate 10, and the gate electrode 13 is away from the flexible substrate 10. Therefore, the transistor T belongs to a top-gate structure. The first pole plate 21 and the gate electrode 13 are located on a same layer. A first interlayer dielectric layer ILD1 is arranged in a side of the first pole plate 21 and the gate electrode 13 away from the flexible substrate 10, and the first interlayer dielectric layer ILD1 serves as the capacitor dielectric layer. The first interlayer dielectric layer ILD1 is arranged on a whole surface of the display area 1a. A second interlayer dielectric layer ILD2 is arranged in a side away from the flexible substrate 10 of both the second pole plate 22 and a part of the first interlayer dielectric layer ILD1 which is not covered by the second pole plate 22. The source electrode 14a and the drain electrode 14b are arranged in a side of the second interlayer dielectric layer ILD2 away from the flexible substrate 10. The source electrode 14a may be connected to a source region of the active layer 11 by a filled via passing through the first interlayer dielectric layer ILD1 and the second interlayer dielectric layer ILD2. The drain electrode 14b may be connected to a drain region of the active layer 11 by a filled via passing through the first interlayer dielectric layer ILD1 and the second interlayer dielectric layer ILD2. The active layer 11 between the source region and the drain region functions as a channel region.

In other embodiments, the transistor T may also belong to a bottom-gate structure. A specific structure of the pixel driving circuit is not limited in embodiments of the present disclosure.

Continue with the illustration in FIG. 3, a passivation layer PVX may be arranged in a side away from the flexible substrate 10 of the source electrode 14a, the drain electrode 14b and a part of the second interlayer dielectric layer ILD2 which is not provided with the source electrode 14a and the drain electrode 14b. A planarization layer PLN is arranged in a side of the passivation layer PVX located in the display area 1a away from the flexible substrate 10.

The anode 30a is connected to the drain electrode 14b of the transistor T by a filled via passing through the planarization layer PLN and the passivation layer PVX. The source electrode 14a of the transistor T may be connected to a power signal line, e.g., VDD.

The metal layer 103 of the flexible substrate 10 may be connected to a fixed potential, for example, to the source electrode 14a of the transistor T.

In other embodiments, the pixel structure 30 may also be a Passive Matrix OLED (PMOLED). The pixel driving circuit between the anode 30a and the flexible substrate 10 is omitted.

Figure 4:
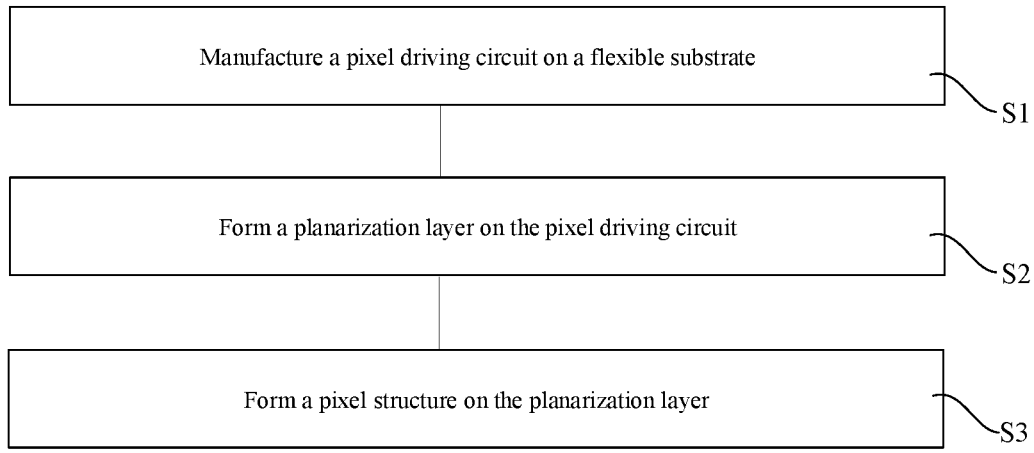
FIG. 4 is a flowchart of a manufacturing method of the display panel according to the first embodiment of the present disclosure.
Figure 5:
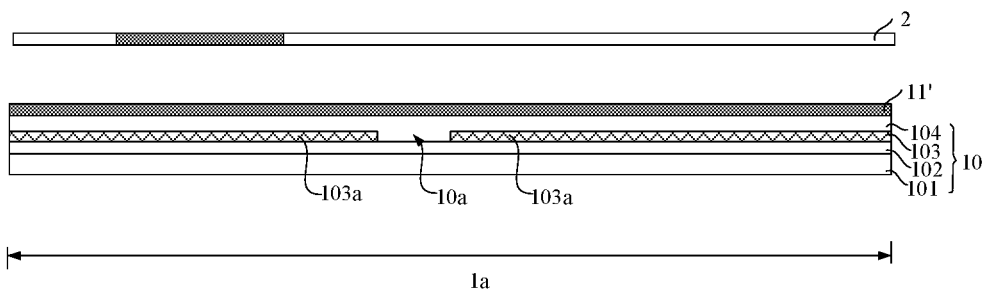
FIG. 5 is a schematic diagram of an intermediate structure corresponding to a process of FIG. 4.

A manufacturing method of the display panel in FIG. 3 is provided by the first embodiment of the present disclosure. FIG. 4 is a flowchart of the manufacturing method. FIG. 5 is a schematic diagram of an intermediate structure corresponding to a process of FIG. 4.

First, referring to FIG. 3 and step S1 in FIG. 4, a pixel driving circuit is manufactured on a flexible substrate 10.

In this embodiment, step S1 may specifically include steps S11 to S18.

At step S11, referring to FIG. 5 and FIG. 3, an active material layer 11' is formed on a whole surface of a second organic layer 104; and the active material layer 11' is patterned to form an active layer 11 in a display area 1a.

A buffer layer may be formed on the whole surface of the second organic layer 104 prior to forming the active material layer 11'. A material for the buffer layer may be silicon nitride, silicon dioxide, or the like.

Referring to FIG. 5, a metal layer 103 of the flexible substrate 10 may be a metal pattern layer. The metal pattern layer includes a plurality of sub metal blocks 103a, where a hollow area 10a is between adjacent sub metal blocks 103a, and the plurality of sub metal blocks 103a and the hollow area 10a correspond to the display area 1a.

Patterning of the active material layer 11' is implemented by using a mask 2, and the mask 2 includes a light-transmitting area and an opaque area. Whether the mask 2 and the flexible substrate 10 are aligned is determined by an alignment detection device located under the flexible substrate 10, that is, located on a side of a first organic layer 101 away from the second organic layer 104. When the mask 2 is aligned with the flexible substrate 10, the metal pattern layer in the flexible substrate 10 may be used as an alignment marker.

At step S12, a gate insulation layer 12 is formed on a whole surface of both the active layer 11 and a part of the second organic layer 104 which is not covered by the active layer 11.

At step S13, a second metal material layer is formed on a whole surface of the gate insulation layer 12; and the second metal material layer is patterned to form a gate electrode 13 and a first pole plate 21.

When a mask for patterning the second metal material layer is aligned with the flexible substrate 10, the metal pattern layer in the flexible substrate 10 may be used as an alignment marker.

At step S14, a first interlayer dielectric layer ILD1 is formed on a whole surface of the gate electrode 13, the first pole plate 21 and a part of the gate insulation layer 12 which is not covered by the gate electrode 13 and the first pole plate 21.

At step S15, a third metal material layer is formed on a whole surface of the first interlayer dielectric layer ILD1; and the third metal material layer is patterned to form a second pole plate 22.

When a mask for patterning the third metal material layer is aligned with the flexible substrate 10, the metal pattern layer in the flexible substrate 10 may be used as an alignment marker.

At step S16, a second interlayer dielectric layer ILD2 is formed on a whole surface of the second pole plate 22 and a part of the first interlayer dielectric layer ILD1 which is not covered by the second pole plate 22.

At step S17, Vias are formed in the second interlayer dielectric layer ILD2, the first interlayer dielectric layer ILD1 and the gate insulation layer 12 in the display area 1a to expose the source and drain regions of the active layer 11 respectively; then, the vias are filled and a source electrode 14a and a drain electrode 14b are formed on the second interlayer dielectric layer ILD2.

When a mask for forming the vias is aligned with the flexible substrate 10, the metal pattern layer in the flexible substrate 10 may be used as an alignment marker. When a mask for forming the source electrode 14a and the drain electrode 14b are aligned with the flexible substrate 10, the metal pattern layer in the flexible substrate 10 may be used as an alignment marker.

At step S18, a passivation layer PVX is formed on the source electrode 14a, the drain electrode 14b and a part of the second interlayer dielectric layer ILD2 which is not covered by the source electrode 14a and the drain electrode 14b.

The active layer 11, the gate insulation layer 12, the gate electrode 13, the source electrode 14a and the drain electrode 14b form a transistor T. The first pole plate 21, the capacitor dielectric layer and the second pole plate 22 form a capacitor C. In other embodiments, the transistor T may also have a bottom-gate structure. A specific structure of the pixel driving circuit is not limited in embodiments of the present disclosure.

Next, at step S2, a planarization layer PLN is formed on the pixel driving circuit.

Step S2 may specifically include: forming the planarization layer PLN on a whole surface of the passivation layer PVX; and patterning the planarization layer PLN and the passivation layer PVX to form vias to expose one of the source electrode 14a and the drain electrode 14b.

When a mask for forming the vias is aligned with the flexible substrate 10, the metal pattern layer in the flexible substrate 10 may be used as an alignment marker.

After that, step S3 is performed: a pixel structure 30 is formed on the planarization layer PLN.

In this embodiment, step S3 may specifically include steps S31 to S34.

At step S31, a first metal material layer is formed on a whole surface of the planarization layer PLN, and the vias are filled with the first metal material layer; and the first metal material layer is patterned to form an anode 30a.

When a mask for forming the anode 30a is aligned with the flexible substrate 10, the metal pattern layer in the flexible substrate 10 may be used as an alignment marker.

At step S32, A pixel definition layer PDL is formed on a whole surface of the anode 30a and a part of the planarization layer PLN which is not covered by the anode 30a; and the pixel definition layer PDL is patterned to form an opening in the pixel definition layer PDL to expose a partial area of the anode 30a.

When a mask for patterning the pixel definition layer PDL is aligned with the flexible substrate 10, the metal pattern layer in the flexible substrate 10 may be used as an alignment marker.

At step S33, an organic light-emitting material layer is evaporation coated to form a light-emitting block 30c within the opening of the pixel definition layer PDL.

When a mask for evaporation coating the organic light-emitting material layer is aligned with the flexible substrate 10, the metal pattern layer in the flexible substrate 10 may be used as an alignment marker.

At step S34, a cathode material layer 301 is evaporation coated on a whole surface of the light-emitting block 30c and the pixel definition layer PDL. The cathode material layer 301 located in the display area 1a forms a cathode 30b.

When a mask for evaporation coating the cathode material layer 301 is aligned with the flexible substrate 10, the metal pattern layer in the flexible substrate 10 may be used as an alignment marker.

Figure 6:
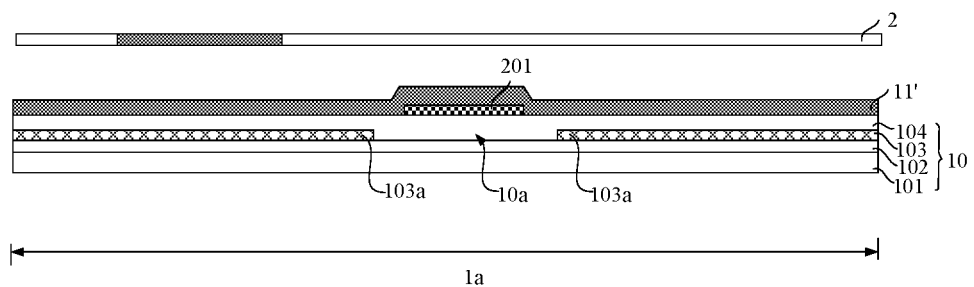
FIG. 6 is a schematic diagram of an intermediate structure corresponding to a manufacturing method of a display panel according to a second embodiment of the present disclosure.

FIG. 6 is a schematic cross-sectional structure diagram of an intermediate structure corresponding to a manufacturing method of a display panel according to a second embodiment of the present disclosure. Referring to FIG. 6, the manufacturing method of the display panel in this embodiment is similar to a manufacturing method of the display panel 1 in FIG. 3, except that a second organic layer 104 has an alignment marker 201 on a side away from a first organic layer 101, and a metal layer 103 includes a hollow area 10a corresponding to the alignment marker 201.

Since an alignment detection device is located on a side of the first organic layer 101 away from the second organic layer 104, therefore, at step S11, when a mask for manufacturing an active layer 11 is aligned with a flexible substrate 10, the alignment marker 201 is exposed from the hollow area 10a so as to use the alignment marker 201 for alignment.

At step S13, when a mask for manufacturing a gate electrode 13 and a first pole plate 21 is aligned with the flexible substrate 10, the alignment marker 201 is exposed from the hollow area 10a so as to use the alignment marker 201 for alignment.

At step S15, when a mask for manufacturing a second pole plate 22 is aligned with the flexible substrate 10, the alignment marker 201 is exposed from the hollow area 10a so as to use the alignment marker 201 for alignment.

At step S17, when a mask for manufacturing vias is aligned with the flexible substrate 10, the alignment marker 201 is exposed from the hollow area 10a so as to use the alignment marker 201 for alignment. Or, when a mask for manufacturing a source electrode 14a and a drain electrode 14b are aligned with the flexible substrate 10, the alignment marker 201 is exposed from the hollow area 10a so as to use the alignment marker 201 for alignment.

At step S31, when a mask for manufacturing an anode 30a is aligned with the flexible substrate 10, the alignment marker 201 is exposed from the hollow area 10a so as to use the alignment marker 201 for alignment.

At step S32, when a mask for forming an opening of a pixel definition layer PDL is aligned with the flexible substrate 10, the alignment marker 201 is exposed from the hollow area 10a so as to use the alignment marker 201 for alignment.

At step S33, when a mask for evaporation coating an organic light-emitting material layer is aligned with the flexible substrate 10, the alignment marker 201 is exposed from the hollow area 10a so as to use the alignment marker 201 for alignment.

At step S34, when a mask for evaporation coating a cathode material layer 301 is aligned with the flexible substrate 10, the alignment marker 201 is exposed from the hollow area 10a so as to use the alignment marker 201 for alignment.

Figure 7:
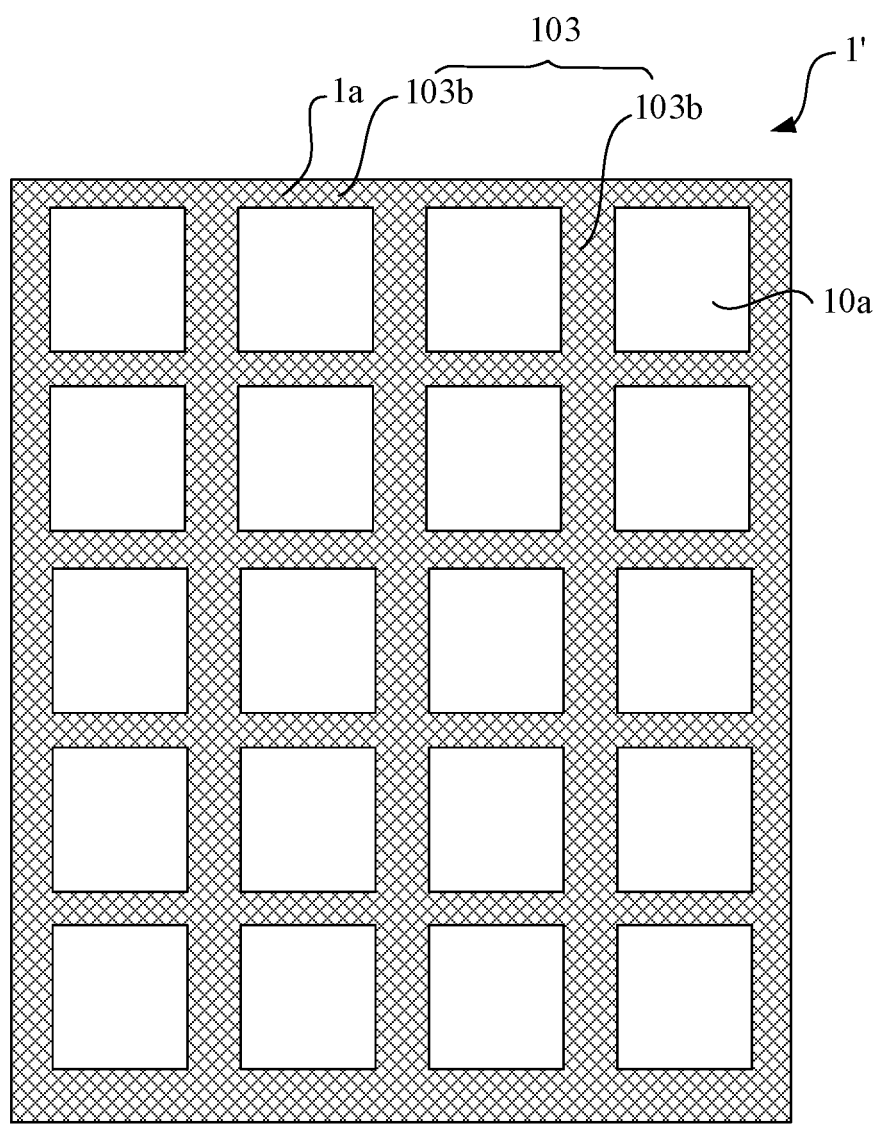
FIG. 7 is a top view of a display panel according to a third embodiment of the present disclosure.

FIG. 7 is a top view of a display panel according to a third embodiment of the present disclosure. Referring to FIG. 7, a display panel 1' and a manufacturing method thereof in this embodiment are similar to a display panel 1 and a manufacturing method thereof in previous embodiments, except that a metal layer 103 is a metal pattern layer including a plurality of connection strips 103b, and the plurality of connection strips 103b define a plurality of hollow areas 10a, and the plurality of connection strips 103b and the plurality of hollow areas 10a correspond to the display area 1a.

Figure 8:
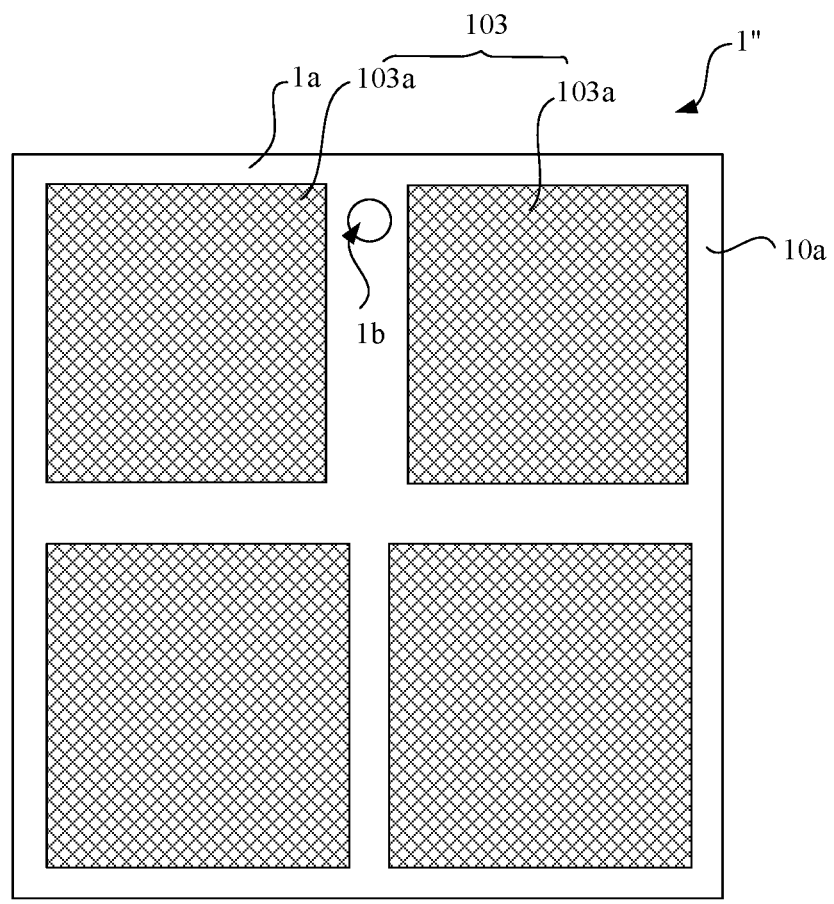
FIG. 8 is a top view of a display panel according to a fourth embodiment of the present disclosure.

FIG. 8 is a top view of a display panel according to a fourth embodiment of the present disclosure. Referring to FIG. 8, a display panel 1" and a manufacturing method thereof in this embodiment are similar to a display panel 1 and a manufacturing method thereof in previous embodiments, except that the display panel 1" includes an image acquisition area 1b, and the image acquisition area 1b is located in the display area 1a; and the image acquisition area 1b corresponds to a hollow area 10a.

The image acquisition area 1b may be used to receive light for an image acquisition device, such as a camera, arranged on one side of the display panel 1".

Based on the above-mentioned display panels 1, 1', or 1", an embodiment of the present disclosure further provides a display device including any of the above-mentioned display panels. The display device may be any product or component having a display function, such as an electronic paper, a mobile phone, a tablet computer, a television, a notebook computer, a digital photo frame, a navigator, and the like.

It is to be noted that in the accompanying drawings, the dimensions of layers and regions may be exaggerated for clarity of illustration. It will be understood that when an element or a layer is referred to as being "above" or "on" another element or layer, it may be directly on the other element, or intervening layers may be present. In addition, it will be understood that when an element or a layer is referred to as being "under" or "below" another element or layer, it may be directly under the other element, or one or more intervening layers or elements may be present. In addition, it will also be understood that when a layer or an element is referred to as being "between" two layers or two elements, it may be the only layer between the two layers or two elements, or one or more intervening layers or elements may be present. Like reference numerals indicate like elements throughout.

In the present disclosure, terms "first" and "second" are used for descriptive purposes only and are not to be construed as indicating or implying a relative importance.

After considering the specification and practicing the present disclosure, the skilled in the art may easily conceive of other implementations of the present disclosure. The present application is intended to cover any variations, uses, or adaptations of the present disclosure, which follow the general principle of the present disclosure and include common knowledge or conventional technical means in the art that are not disclosed in the present disclosure. The specification and examples are to be regarded as illustrative only. The true scope and spirit of the present disclosure are pointed out by the following claims.

It should be understood that this application is not limited to the precise structures described above and shown in the accompanying drawings, and various modifications and changes can be made without departing from the scope of this application. The scope of the present disclosure is limited only by the appended claims.

The invention claimed is:

1. A display panel, comprising:
a flexible substrate, wherein the flexible substrate comprises a first organic layer, an inorganic barrier layer, a metal layer and a second organic layer which are stacked in sequence; and
a pixel structure on the flexible substrate, wherein the display panel comprises a display area, the pixel structure is in the display area;
wherein the metal layer is a metal pattern layer comprising a plurality of connection strips defining a plurality of hollow areas, and the plurality of connection strips and the plurality of hollow areas correspond to the display area;
wherein an orthographic projection of a hollow area in the hollow areas on the first organic layer is in an orthographic projection of the pixel structure on the first organic layer;
wherein the display panel comprises an image acquisition area located in the display area; the image acquisition area corresponds to a hollow area;
wherein the metal layer is connected to a fixed potential.

2. The display panel of claim 1, wherein the metal pattern layer comprises at least one alignment marker for aligning a mask for manufacturing the pixel structure.

3. The display panel of claim 1, wherein a material of the metal layer comprises at least one of aluminum, silver, nickel, magnesium or molybdenum.

4. The display panel of claim 3, wherein a thickness of the metal layer ranges from 50 Å to 10,000 Å.

5. A display device, comprising the display panel according to claim 1.

6. A display panel manufacturing method, wherein
a display panel comprises a flexible substrate, the flexible substrate comprises a first organic layer, an inorganic barrier layer, a metal layer and a second organic layer which are stacked in sequence; and
manufacturing a pixel structure on the flexible substrate, wherein the display panel comprises a display area, the pixel structure is in the display area;
wherein the metal layer is a metal pattern layer comprising a plurality of connection strips defining a plurality of hollow areas, and the plurality of connection strips and the plurality of hollow areas correspond to the display area;
wherein an orthographic projection of a hollow area in the hollow areas on the first organic layer is in an orthographic projection of the pixel structure on the first organic layer;
wherein the display panel comprises an image acquisition area located in the display area; the image acquisition area corresponds to a hollow area;
wherein the metal layer is connected to a fixed potential.

7. The display panel manufacturing method of claim 6, wherein manufacturing the pixel structure comprises:
forming a first metal material layer on a side of the second organic layer away from the first organic layer, patterning the first metal material layer to form an anode;
forming a pixel definition layer on a side of the anode and the second organic layer away from the first organic layer, patterning the pixel definition layer to form an opening exposing the anode;
evaporation coating an organic light-emitting material layer within the opening; and
evaporation coating a cathode material layer on a side of the organic light-emitting material layer and the pixel definition layer away from the first organic layer;
wherein the metal layer of the flexible substrate is a metal pattern layer; the metal pattern layer is functioned as at least one of:
an alignment marker when a mask for patterning the first metal material layer is aligned with the flexible substrate, and/or the metal pattern layer is functioned as
an alignment marker when a mask for patterning the pixel definition layer is aligned with the flexible substrate,
an alignment marker when a mask for evaporation coating the organic light-emitting material layer is aligned with the flexible substrate, or
an alignment marker when a mask for evaporation coating the cathode material layer is aligned with the flexible substrate.

8. The display panel manufacturing method of claim 6, wherein prior to manufacturing the pixel structure, manufacturing a pixel driving circuit on the side of the second organic layer away from the first organic layer, the pixel driving circuit comprises at least one of a transistor or a capacitor;
the transistor comprises a gate electrode, an active layer, a source electrode and a drain electrode;
the capacitor comprises a first pole plate and a second pole plate;
wherein the metal layer of the flexible substrate is a metal pattern layer; the metal pattern layer is functioned as at least one of:
an alignment marker when a mask for manufacturing the gate electrode is aligned with the flexible substrate,
an alignment marker when a mask for manufacturing the active layer is aligned with the flexible substrate,
an alignment marker when a mask for manufacturing the source electrode and the drain electrode is aligned with the flexible substrate,
an alignment marker when a mask for manufacturing the first pole plate is aligned with the flexible substrate, or
an alignment marker when a mask for manufacturing the second pole plate is aligned with the flexible substrate.

9. The display panel manufacturing method of claim 6, wherein manufacturing the pixel structure comprises:
forming a first metal material layer on a side of the second organic layer away from the first organic layer, patterning the first metal material layer to form an anode;
forming a pixel definition layer on a side of the anode and the second organic layer away from the first organic layer, patterning the pixel definition layer to form an opening exposing the anode;
evaporation coating an organic light-emitting material layer within the opening; and
evaporation coating a cathode material layer on a side of the organic light-emitting material layer and the pixel definition layer away from the first organic layer;
wherein the second organic layer has an alignment marker on a side away from the first organic layer, and the metal layer has a hollow area, the hollow area corresponds to the alignment marker to implement at least one of:
exposing the alignment marker when the mask for patterning the first metal material layer is aligned with the flexible substrate, exposing the alignment marker when the mask for patterning the pixel definition layer is aligned with the flexible substrate, exposing the alignment marker when the mask for evaporation coating the organic light-emitting material layer is aligned with the flexible substrate, or exposing the alignment marker when the mask for evaporation coating the cathode material layer is aligned with the flexible substrate.

10. The display panel manufacturing method of claim 6, wherein prior to manufacturing the pixel structure, manufacturing a pixel driving circuit on the side of the second organic layer away from the first organic layer, the pixel driving circuit comprises at least one of a transistor or a capacitor;

the transistor comprises a gate electrode, an active layer, a source electrode and a drain electrode;

the capacitor comprises a first pole plate and a second pole plate;

wherein the second organic layer has an alignment marker on a side away from the first organic layer, and the metal layer has a hollow area, the hollow area corresponds to the alignment marker to implement at least one of:

exposing the alignment marker when the mask for manufacturing the gate electrode is aligned with the flexible substrate, exposing the alignment marker when the mask for manufacturing the active layer is aligned with the flexible substrate, exposing the alignment marker when the mask for manufacturing the source electrode and the drain electrode is aligned with the flexible substrate, exposing the alignment marker when the mask for manufacturing the first pole plate is aligned with the flexible substrate, or exposing the alignment marker when the mask for manufacturing the second pole plate is aligned with the flexible substrate.

11. The display panel manufacturing method of claim 6, wherein a material of the metal layer comprises at least one of aluminum, silver, nickel, magnesium or molybdenum.

12. The display panel manufacturing method of claim 11, wherein a thickness of the metal layer ranges from 50 Å to 10,000 Å.

* * * * *